(12) United States Patent
Wu et al.

(10) Patent No.: US 8,760,940 B2
(45) Date of Patent: Jun. 24, 2014

(54) READING MEMORY DATA

(71) Applicant: Taiwan Semiconductor Manufacturing Company, Ltd., Hsinchu (TW)

(72) Inventors: Jui-Jen Wu, Hsinchu (TW); Shao-Yu Chou, Chu Pei (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 0 days.

(21) Appl. No.: 13/711,354

(22) Filed: Dec. 11, 2012

(65) Prior Publication Data

US 2013/0194880 A1    Aug. 1, 2013

Related U.S. Application Data

(63) Continuation of application No. 12/908,670, filed on Oct. 20, 2010, now Pat. No. 8,351,280.

(51) Int. Cl.
*G11C 5/14*    (2006.01)

(52) U.S. Cl.
CPC .................................. *G11C 5/147* (2013.01)
USPC ............ 365/189.09; 365/185.21; 365/185.13; 365/185.16; 365/185.2; 365/189.02

(58) Field of Classification Search
CPC ............... G11C 16/28; G11C 11/4091; G11C 11/5642; G11C 13/0026
USPC ............. 365/189.09, 185.21, 185.13, 185.16, 365/185.2, 189.08, 210.1
See application file for complete search history.

(56) References Cited

U.S. PATENT DOCUMENTS

2007/0070753 A1*    3/2007    Tran .............................. 365/207
2012/0020176 A1    1/2012    Lu et al.

* cited by examiner

*Primary Examiner* — Thong Q Le
(74) *Attorney, Agent, or Firm* — Lowe Hauptman & Ham, LLP

(57) ABSTRACT

A circuit includes a memory array comprising K number of rows. The circuit further including a reference column. The reference column includes M cells of a first cell type configured to provide a first leakage current, K-M cells of a second cell type different from the first cell type, the K-M cells are configured to provide a second leakage current, and a reference data line connected to the cells of the first cell type and the cells of the second cell type. The circuit further includes a sensing circuit configured to determine a value stored in a memory cell of the memory array based on a voltage of the reference data line.

20 Claims, 8 Drawing Sheets

READING MEMORY DATA

RELATED APPLICATIONS

This application is a continuation of application Ser. No. 12/908,670, entitled "Reading Memory Data" filed on Oct. 20, 2010, the entirety of which is incorporated herein by reference.

TECHNICAL FIELD

The present disclosure is related to reading memory data on a data line.

BACKGROUND

In various approaches, data from a bit cell (e.g., a memory cell) is read by detecting the logic level at a corresponding read bit line (e.g., a read bit line RBL). A P-type Metal Oxide Silicon transistor (PMOS transistor) implemented as a feedback keeper is used to compensate the leakage current from unselected bit cells and thus improves "read one" operations, e.g., reading a logic high level (a High), at read bit line RBL. In "read zero" situations, e.g., reading a logic low level (a Low) at read bit line RBL, however, the PMOS keeper slows down the RBL discharge speed. In some situations, if the PMOS keeper sinks a lot of current (e.g., the PMOS transistor has a high conductivity) and/or the cell current is not high enough, the cell current cannot discharge (e.g., pull) read bit line RBL from a High to a Low. As a result, the read operation fails. Variations in the semiconductor manufacturing process also cause the cell current to vary at different voltage and temperature conditions, which also increases the failure rate when the read bit line RBL is read.

BRIEF DESCRIPTION OF THE DRAWINGS

The details of one or more embodiments of the disclosure are set forth in the accompanying drawings and the description below. Other features and advantages will be apparent from the description, drawings, and claims.

Like reference symbols in the various drawings indicate like elements.

DETAILED DESCRIPTION

Figure 1:
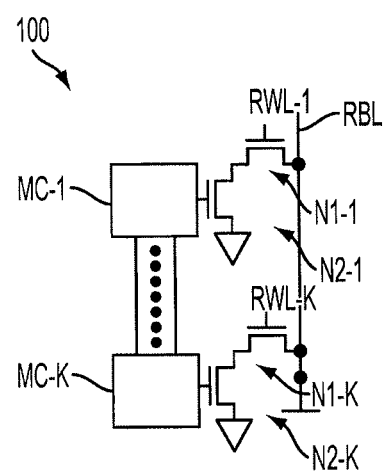
FIG. 1 is a diagram illustrating a column of a memory array, in accordance with some embodiments.

Embodiments, or examples, illustrated in the drawings are disclosed below using specific language. It will nevertheless be understood that the embodiments and examples are not intended to be limiting. Any alterations and modifications in the disclosed embodiments, and any further applications of the principles disclosed in this document are contemplated as would normally occur to one of ordinary skill in the pertinent art. Reference numbers may be repeated throughout the embodiments, but they do not require that feature(s) of one embodiment apply to another embodiment, even if they share the same reference number.

Some embodiments can have one or a combination of the following features and/or advantages. In some embodiments, the single-end read circuit includes a leakage tracking column so that the PMOS feedback keeper is eliminated, which improves the read speed, and prevents data contention between the cell current and that of the PMOS keeper.

Figure 3:
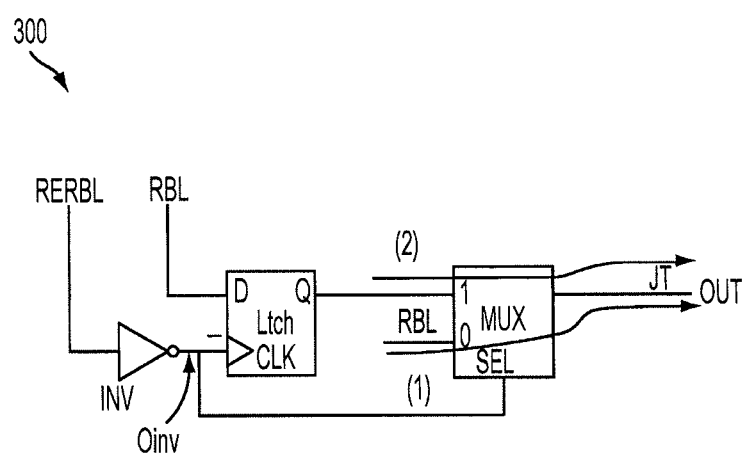
FIG. 3 is a diagram of a circuit illustrating reading data on a read bit line of the memory array in FIG. 1, in accordance with some embodiments.

FIGS. 3 and 4 are a circuit and waveforms for a circuit that is adapted to read a memory cell or cells that have either high or low leakage. The circuit adapts the method of reading a bit line depending upon the leakage on a reference bit line.

Figure 5:
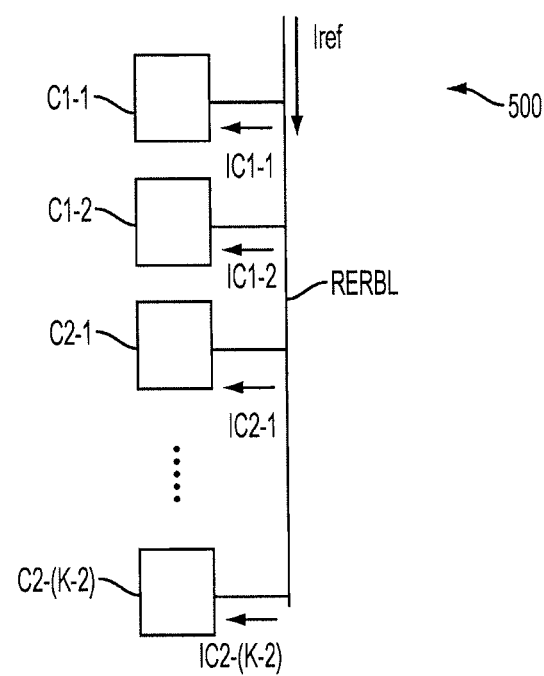
FIG. 5 is a block diagram of a reference column used in the circuit of FIG. 3, in accordance with some embodiments.
Figure 6:
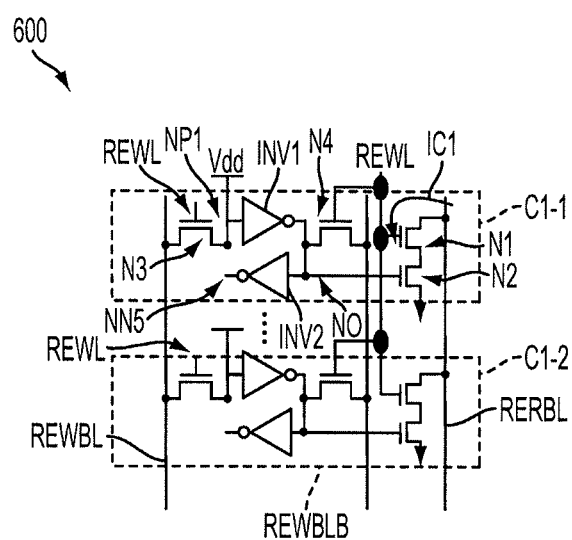
FIG. 6 is a diagram illustrating a first cell type used in the reference column of FIG. 5, in accordance with some embodiments.
Figure 7:
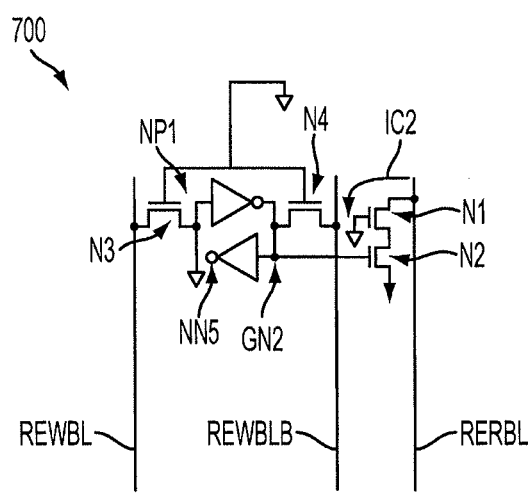
FIG. 7 is a diagram illustrating a second cell type used in the reference column of FIG. 5, in accordance with some embodiments.

FIGS. 5, 6 and 7 are circuits adapted to provide a memory cell with known leakage. In some embodiments, the circuit of FIG. 3 is combined with one or more of the circuits of FIGS. 5, 6 and 7 to operate with a predetermined leakage. In other embodiments, the circuit of FIG. 3 is not combined with the circuits of FIGS. 5, 6 and 7.

Exemplary Memory Circuits

FIG. 1 is a diagram of a column 100 of a memory array in accordance with some embodiments. In this illustration, column 100 includes K memory cells MC, e.g., memory cells MC-1 to MC-K. The number of memory cells MC in column 100, e.g., the value of K, varies, depending on the configuration of the memory cell array, including, for example, a value of 16, 32, 64, etc. A read bit line, e.g., read bit line RBL is coupled to the K number of memory cell MCs in column 100. In some embodiments, a read word line RWL corresponding to a memory cell MC is coupled to every memory cell in a row (not shown). For illustration, FIG. 1 shows read word line RWL-1 and RWL-K corresponding to row 1 and row K, respectively.

In some embodiments, a memory cell MC includes six transistors, and is commonly called a 6T cell, which is known in the art. Transistors N1 and N2 corresponding to a memory cell MC are used in reading data in a memory cell MC. The 6T cell together with the corresponding pair of transistors N1 and N2 are commonly called an eight-transistor (8T) memory cell.

Figure 2:
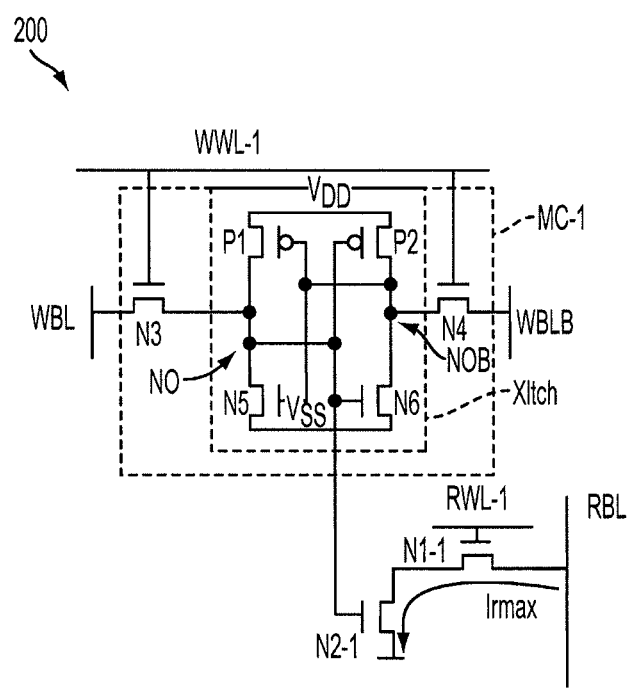
FIG. 2 is a diagram of a memory cell of the memory array in FIG. 1, in accordance with some embodiments.

FIG. 2 is a diagram of an 8T memory cell, e.g., memory cell 200, comprising a memory cell MC-1 coupled to transistor N1-1 and N2-1, in accordance with some embodiments. Memory cell 200, via transistor N3 and N4, is also coupled to a write word line, e.g., WWL, and a pair of write bit lines, e.g., write bit line WBL-1 and WBLB-1 for writing. PMOS transistors P1 and P2, and NMOS transistors N5 and N6 form a cross latch, e.g., cross latch Xltch for memory cell MC-1 or for memory cell 200. Storage nodes NO and NOB store data for memory cell 200.

In some embodiments, when a cell MC of the memory array is accessed (e.g., for reading), a plurality of memory cells MC in a row is accessed (e.g., the accessed memory cells AMC). Memory cells in the memory array other than the accessed memory cells AMC are called un-accessed memory cells UAMC. A column having an accessed memory cell AMC is called an accessed column AC. A column having all un-accessed memory cells UAMC is called an un-accessed column UAC. In some embodiments, for an accessed column AC, there is a fix number (e.g., 3, 7, 15, etc.) of un-accessed columns.

Before a memory cell MC is accessed for reading, the corresponding read bit line RBL is pre-charged to a High. The term "pre-charged" (versus "charged") is used to indicate that read bit line RBL is charged (e.g., brought to a High) prior to reading. When a memory cell MC is accessed for reading, the corresponding read word line RWL is activated and the data is read by detecting the logic level at the corresponding read bit line RBL. If node NO stores a Low then transistor N2-1 is off, e.g., acting as an open circuit. As a result, read bit line RBL is disconnected from transistors N1-1 and N2-1, and thus remains a High at the pre-charge level. In contrast, if node NO stores a High, transistor N2-1 is on, which together with the then on transistor N1-1 pulls read bit line RBL to the voltage level at the source of transistor N2-1, which is ground, or Low. The current flowing on read bit line RBL while read bit line is read is called read current Iread. The current flowing from read bit line RBL through transistor N2-1 and N2-1 through ground when node NO stores a High is, however, significantly more than the current flowing through read bit line RBL when node NO stores a Low, and is the worst-case read current. Current Irmax shown in FIG. 2 illustrates the read current when node NO stores a High and RBL is eventually pulled to Low, which is the worst-case read current.

For illustration, memory cell MC-1 is accessed. As a result, read word line RWL-1 is activated, which turns on transistor N1-1. If the data stored in node NO of memory cell MC-1 High, the gate of transistor N2-1 is High, and transistor N2-1 is turned on. As a result, transistors N1-1 and N2-1, being on, pull (e.g., discharge) the voltage level at read bit line RBL to the voltage level at the source of transistor N2-1, which is ground. In contrast, if the data stored in node NO of memory cell MC-1 is Low, the gate of transistor N2-1 is Low, and transistor N2-1 is off, which acts as an open circuit. As a result, read bit line RBL remains High. The data at read bit line RBL is processed (e.g., inverted) to reflect (e.g., match) the data stored in node NO.

In some embodiments, even if memory cell 200 is not accessed, current leaks from read bit line RBL through transistor N1-1 and N2-1, and the leakage current is worst when node NO stores a High. The leakage current without being controlled can cause a read error on read bit line RBL. In some embodiments, mechanisms are provided to prevent the erroneous read due to the leakage current in un-accessed memory cells in a column when a memory cell is read.

In FIG. 2, the gate of transistor N2-1 (e.g., gate GN2) is coupled to node NO, but gate GN2 can be coupled to node NOB, and the operation of node NO applies to the operation of node NOB as would be recognizable by a person of ordinary skill in the art.

Exemplary Read Circuit

FIG. 3 is a diagram of a read circuit 300, in accordance with some embodiments. In this illustration, circuit 300 is used to detect data on a read bit line RBL with reference to the data on a reference read bit line RERBL. Circuit 300 is adapted to read a memory cell or cells such as the memory cells of FIGS. 1 and 2. The circuit adapts the method of reading the bit line RBL depending upon the leakage on the reference bit line RERBL.

Here, when the data in any memory cell of a column, e.g., memory cell MC-1 to MC-K in column 100, is accessed for reading, circuit 300 provides the read data of that memory cell MC on output Out, which is then processed to match the data stored in memory cell MC. For illustration, memory cell MC-1 is accessed, but the principles described in this document apply to any other memory cell. Memory cells MC-2 to MC-K in column 100 are un-accessed (e.g., unselected) memory cells.

Latch Ltch latches the data at input D to output Q at the rising edge of clock CLK. The data on read bit line RBL is fed to input D of latch Ltch. Reference read bit line (RERBL) is used to as a clock to latch (e.g., to clock) the data on read bit line RBL from input D to output Q of latch Ltch. For example, when reference bit line REBL turns from a High to a Low, output of inverter INV, e.g., output Oinv, turns High, and provides a rising edge to clock the data at input D (e.g., the data on read bit line RBL) to output Q. At the same time, because output Oinv is High, the SEL input of multiplexer MUX is activated to select output Q (e.g., the latched data) to appear at output Out. Output Out thus receives the latched data as shown in path (2). If reference read bit line RERBL, however, does not turn from a High to a Low (e.g., remains High), there is no rising edge of the clock to latch the data at input D (e.g., the data on read bit line RBL). At the same time, output Oinv is inverted from reference read bit line RERBL to be Low, which provides a Low to input SEL of multiplexer MUX. As a result, the data on read bit line RBL that is at the Low input (e.g., the "0" input) of multiplexer MUX is selected as the data output at output Out. In other words, the data on read bit line RBL is selected as the output at output Out, which is shown as path (1). In some embodiments, reference read bit line RERBL is discharged (e.g., pulled towards a Low) by current Iref, which, for example, is generated by circuit 500 in FIG. 5.

In FIG. 3, inverter INV is used to invert reference read bit line RERBL to adapt to the positive edge trigger of the CLK input of latch Ltch. In embodiments, where input clock CLK is negative edge trigger reference read bit line RERBL is directly used to trigger latch Ltch without inverter INV. Further, latch Ltch and multiplexer MUX are used for illustration, other circuits that implement the following operation are within the scope of various embodiments. For example, when reference read bit line RERBL does not trip (e.g., does not change the logic level from a High to a Low), the data on read bit line RBL is provided as the output data, but when reference read bit line RERBL trips, the data on read bit line RBL at the trip point time is selected as the output.

Exemplary Wave Forms

In some embodiments, Latch Ltch includes an inverter, e.g., an LINV (not shown) at the input D. Each of inverter INV and LINV determines whether its input is High or Low based on a trip point, below which the data is Low, and above which the data is High. For illustration, the trip point of inverter LINV is called trip point Ltrip, and the trip point of inverter INV is called Trip. In some embodiments, trip point Trip and trip point Ltrip are substantially the same (e.g., equal).

In some embodiments, while read bit line RBL is read, a current, e.g., current Iref is generated to effect the voltage level of reference read bit line RERBL, based on which the logic level of read bit line RBL is detected, e.g., as latched or unlatched through latch Ltch. Further, the current flowing through read bit line RBL is called read current Iread. Reference current Iref and current Iread cause reference read bit line RERBL and read bit line RBL to be discharged, respectively. The term "discharge" refers to the voltage level on reference read bit line REBL or read bit line RBL being pulled down (e.g., from a High towards a Low).

Figures 4A, 4B:
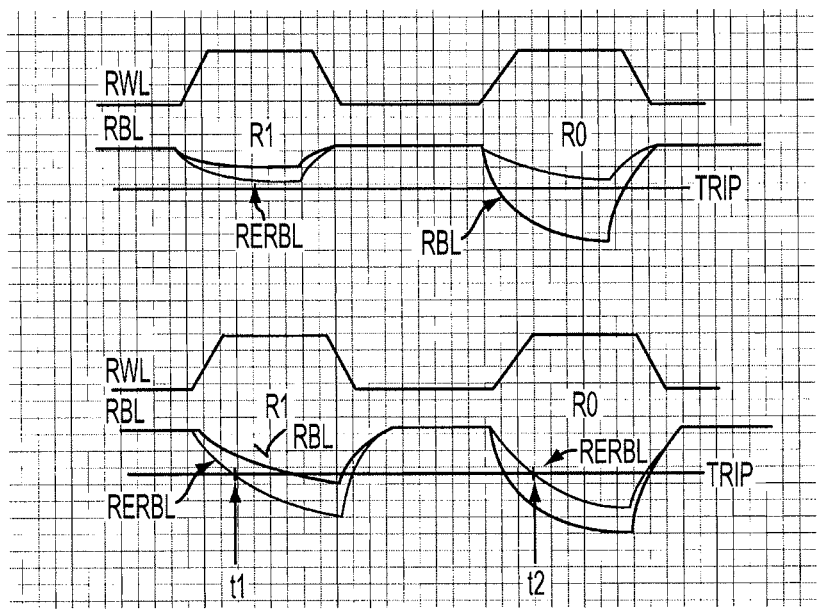
FIGS. 4A and 4B are graphs of waveforms illustrating the operation of the circuit in FIG. 3, in accordance with some embodiments.

FIGS. 4A and 4B are graphs of waveforms illustrating the behavior of reference read bit line RERBL and read bit line RBL, in accordance with some embodiments. In both FIGS. 4A and 4B, reading or detecting the logic level of a read bit line RBL occurs after read word line RWL is High for a period of time (e.g., after a set up time with respect to the rising edge of read word line RWL). Further, because in some embodiments, trip point Trip and trip point Ltrip are substantially the same, "Trip" is used to indicate the trip point for both trip point Trip and Ltrip.

In FIG. 4A, the leakage current Ileak is little (e.g., a light leakage current situation). In this situation, when the data on read bit line RBL is High (shown as read one or R1), current Iref is higher than current Iread. As a result, reference read bit line RERBL is pulled lower than read bit line RBL, but reference read bit line RERBL does not trip. Stated another way, both read bit line RBL and reference read bit line RERBL stay High, despite the leakage current. In contrast, when the data on read bit line RBL is Low (e.g., shown as read zero or R0), current Iread is higher than current Iref. As a result, read bit line RBL is pulled down faster than reference read bit line RERBL being pulled down. Read bit line RBL eventually trips, e.g., turns from a High to a Low. In effect, reference read bit line RERBL remains High, but read bit line RBL turns Low. In some embodiments, when leakage current Ileak is light, the data on read bit line RBL is directly used as the read data, e.g., shown as path (2) in FIG. 3.

In FIG. 4B, leakage current Ileak is significant. In this situation, when the data on read bit line RBL is High (shown as R1), current Iref is higher than current Iread, reference read bit line RERBL is pulled lower than read bit line RBL. Both read bit line RBL and reference read bit line RERBL eventually trip, i.e., both read bit line RBL and reference read bit line RERBL turn Low. Reference read bit line RERBL, however, turns Low prior to read bit line RBL turning Low. In some embodiments, at the time reference read bit line RERBL turns Low (e.g., time t1), the data on read bit line RBL is latched and the latched data is used as the output at output Out in FIG. 3. Because at time t1, read bit line RBL has not turned Low, i.e., read bit line RBL is still High, latching read bit line RBL is latching High data, and thus results in a High at output Out, as shown as path (1) in FIG. 3.

In contrast, when the data on read bit line RBL is Low (shown as R0), current Iread is higher than current Iref. As a result, read bit line RBL is pulled down faster than reference read bit line RERBL being pulled down, and both read bit line RBL and reference read bit line RERBL eventually turn Low. Even though both reference read bit line RERBL and read bit line RBL turn Low, read bit line RBL turns Low prior to reference bit line RERBL turning Low. In some embodiments, at the time reference read bit line RERBL turns Low (e.g., time t2), the read bit line RBL is latched and the latched data is used as the output at output Out in FIG. 3. Because at time, t2, read bit line RBL has turned Low, latching read bit line RBL is latching a Low data and thus results in a Low at output Out, as shown as path (1) in FIG. 3.

In some embodiments, current Iref is configured such that current Iref is between the current (e.g., current Irmax) when read bit line RBL is pulled from a High to a Low (e.g. by transistors N1 and N2) and the worst case of the leakage current Ileak in a column to be read. Further, current Ileak is worst when nodes NO of un-selected (e.g., un-accessed) memory cells in the read column store High data. Current Irmax is the current flowing from read bit line RBL through transistors N1 and N2 while read bit line RBL is being read, and node NO stores a High.

Exemplary Reference Circuits

FIGS. 5, 6 and 7 are circuits adapted to provide memory cells with a known reference leakage. FIG. 5 is a diagram of a column 500 illustrating a reference column, in accordance with some embodiments. Column 500 includes two different types of cells, e.g., cell C1 and cell C2 (collectively called cell C). Each of cells C1 and C2 sinks a current IC1 and a current IC2, respectively, providing the known reference leakage. In some embodiments, the total number of cells C in column 500 is the same as the total number of memory cells MC in column 100. For example, if column 100 has K number of memory cells MC, then column 500 has K number of cells C. Of the K number of cells C in column 500, there are two cells C1 (e.g., cells C1-1 and C1-2) and K−2 number of cells C2 (cell C2-1 to C2-(K−2). A cell C is modified from an 8T memory cell 200, in which a cell C has similar transistors, e.g., transistors P1, P2, N3, N4, N5, N6, N1 and N2, but with different configurations. Column 500 is used to generate current Iref, which, in some embodiments, is the sum of all currents flowing from reference read bit line RERBL to cells C. As a result, current Iref is the sum of currents IC1-1, IC1-2, and IC2-1 to IC2-(K−2), corresponding to cells C1-1, C1-2, C2-1 to C2-(K−2). In some embodiments, current IC1-1 is the same (e.g., substantially the same) as current IC1-2. Similarly, each of current IC2-1 to IC2-(K−2) are the same (e.g., substantially the same) as each other. In effect, current Iref is the sum of two currents of value IC1 and K−2 currents of value IC2.

In some embodiments, one reference column 500 is generated in a memory array. Each time a column is selected for reading, reference column 500 is used with the selected column to be read as illustrated in FIG. 3.

FIG. 6 is a diagram 600 illustrating two cells C1 (e.g., cell C1-1 and cell C1-2), in a column 500, in accordance with some embodiments. To simplify the drawings, each cross latch Xltch of each cell C1 that includes transistors P1, P2, N5 and N6 is shown as two inverters IN1 and INV2, and is recognizable by a person of ordinary skill in the art. Further, only the details of one cell C1 are labeled.

The gates of transistors N1, N2, N3, and N4 of cells C1-1 and C1-2 are coupled together and to reference word line REWL, which, when activated, is High.

The drains of transistors P1 and N5 are no longer coupled together. Node NP1, which couples the drain of transistor P1 and the drain of transistor N3 and is set to a High (e.g., voltage Vdd) while node NN5, which is the drain of transistor N5, is floating (e.g., not connected to another circuit).

In general, node NO, which is the gate of transistor N2 and also the output of inverter INV1, is Low because node NP1 is High. After reference word line REWL is activated that turns on transistors N3 and N4, node NO is raised by a voltage (e.g., voltage Vraise), which is about 100 mV-200 mV in some embodiments. Because of Vraise at the gate of transistor N2, transistor N2 is on "slightly," e.g., transistor N2 is near a conduction state to be completely on, which causes current IC1 to flow (e.g., to leak) from reference bit line REBL through transistor N1 and N2 to ground as shown.

Reference write bit lines REWBL and REWBLB are set to High (e.g., voltage Vdd) so that when reference word line is High, the High on reference write bit lines REWBL and REWBLB generate a current flowing from reference write bit lines REWBL and REWBLB into the storage nodes of cells C1 and thus induces higher leakage for reference read bit line RERBL.

FIG. 7 is a diagram 700 of a cell C2, in accordance with some embodiments. Compared with an 8T-cell 200, cell C2 has similar components but with difference configurations.

In cell C2, the gates of transistors N1, N3, and N4 are grounded (e.g., set to Vss, Low), causing transistor N1, N3, and N4 to turn off. Node NN5 is floating (e.g., not coupled to any circuit).

Node NP1 is grounded, which causes node NO, the gate of transistor N2, to be High and transistor N2 to turn on. Because transistor N2 is on, current IC2 flows (e.g., leaks) from reference read bit line RERBL through transistor N1 and N2 as shown.

In FIGS. 5-7, current Iref comprises two currents IC1 and K-2 currents IC2, which is greater than current Ileak (the leakage current in a column due to un-accessed cells) and less than current Irmax.

FIGS. 5-7 show circuits illustrating an implementation such that current Iref is in between current Irmax and current Ileak. Other circuits serving the same function are within the scope of various embodiments.

Exemplary Method

Figure 8:
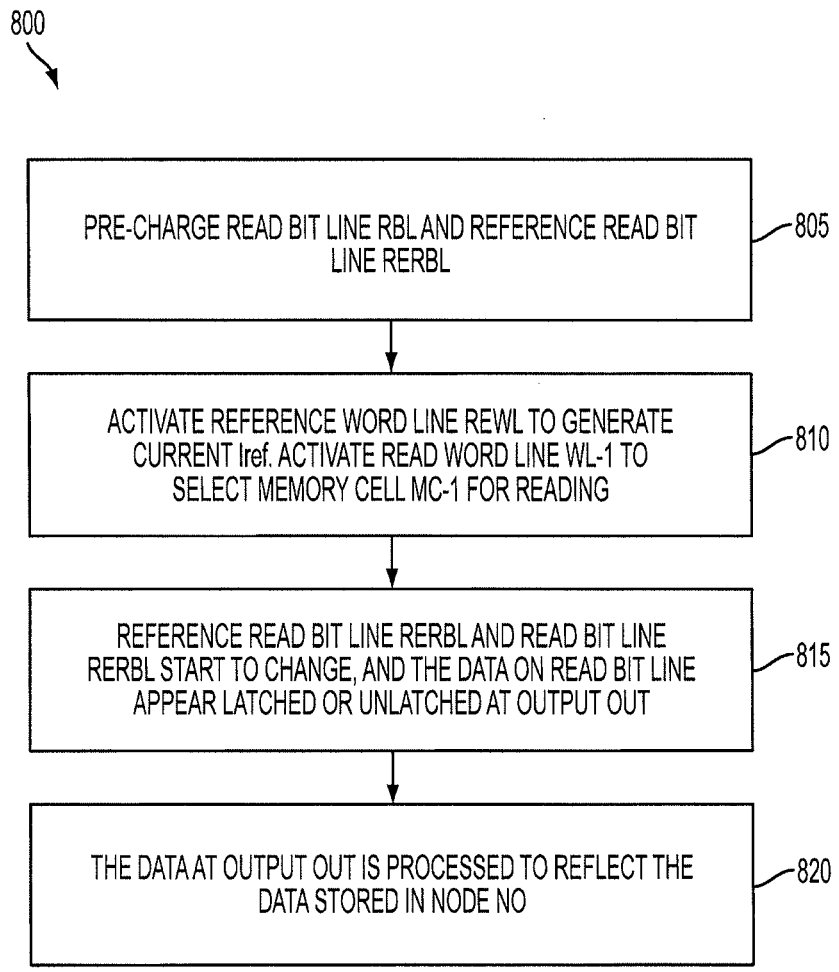
FIG. 8 is a flowchart illustrating a method of operation of the circuit in FIG. 5, in accordance with some embodiments.

FIG. 8 is a flowchart 800 illustrating a method of reading a memory cell MC using circuit 500 in FIG. 5, in accordance with some embodiments. For illustration, the data in memory cell MC-1 is read, but the principle described herein applies to other memory cell.

In step 805, read bit line RBL and reference read bit line REBL are pre-charged to a High.

In step 810, reference word line REWL is activated to turn on transistors N5 and N6 in cells C1-1 and C1-2 of column 500 and thus generate current Iref. At the same time, read word line WL-1 is also is activated to select memory cell MC-1 (and other memory cell MC in row 1) for reading. For illustration, reading the data in memory cell MC-1 is illustrated, but the reading principles apply to other accessed memory cells.

In step 815, the voltage level on read bit line RBL changes based on the data stored in node NO and current Tread. At the same time, the voltage level on reference bit line REBL changes based on current Ileak. The data on read bit line RBL is reflected at output Out of circuit 300, latched or unlatched. For example, in the case of a light leakage situation, reference read bit line RERBL does not trip, output Oinv that appears at input SEL of multiplexer MUX is Low, which causes the data on read bit line RBL at the input 0 of multiplexer MUX to be selected as output at output Out. In the case of heavy leakage situations, the reference read bit line RERBL trips to a Low causing output Oinv to be High, which serves as a clock and latches the data on read bit line RBL at the D-input of latch Ltch to output Q. At the same time, the SEL input of multiplexer MUX (e.g., which is the same as output Oinv) is High causing the latched data on read bit line at input "1" (e.g., input High) of multiplexer to be selected as output at output Out.

In step 820, the data at output Out is processed to match the data stored in node NO. For example, if the data stored in node NO is Low, read bit line RBL is High, which appears as High at output Out, and is then inverted to match the Low data stored in node NO. Similarly, if the data stored in node NO is High, read bit line RBL is Low, which appears as Low at output Out, and is then inverted to match the High stored in node NO.

Some embodiments regard a circuit including a memory array comprising K number of rows. The circuit further including a reference column. The reference column includes M cells of a first cell type configured to provide a first leakage current, K-M cells of a second cell type different from the first cell type, the K-M cells are configured to provide a second leakage current, and a reference data line connected to the cells of the first cell type and the cells of the second cell type. The circuit further includes a sensing circuit configured to determine a value stored in a memory cell of the memory array based on a voltage of the reference data line.

Some embodiments regard a circuit including a memory array including K number of rows of memory cells. The reference column includes M cells of a first cell type configured to provide a first leakage current, K-M cells of a second cell type different from the first cell type, and the K-M cells are configured to provide a second leakage current. The reference column further includes a reference data line connected to the cells of the first cell type and the cells of the second cell type. The reference column is configured to provide a reference current on the reference data line, the reference current being equal to a sum of a total of the first leakage current for each of the M cells of the first cell type and a total of the second leakage current for each of the K-M cells of the second cell type. The circuit further includes a sensing circuit configured to determine a value stored in a memory cell of the memory array based on the reference current.

Some embodiments regard a method of reading data stored in a memory cell of a column of memory cells. The method includes activating the memory cell, wherein the column of memory cells comprises K rows, and a data voltage results from the activating the memory cell. The method further includes activating a reference column, the reference column comprising M cells of a first cell type, K-M cells of a second cell type different from the first cell type, and a reference data line connected to the cells of the first cell type and the cells of the second cell type, wherein a reference voltage results from activating the reference column. The method further includes determining the data stored in the memory cell based on the reference voltage and the data voltage. The above methods show exemplary steps, but they are not necessarily performed in the order shown. Steps may be added, replaced, changed order, and/or eliminated as appropriate, in accordance with the spirit and scope of disclosed embodiments.

A number of embodiments have been described. It will nevertheless be understood that various modifications may be made without departing from the spirit and scope of the disclosure. For example, the various transistors being shown as a particular dopant type (e.g., NMOS and PMOS) are for illustration purposes, embodiments of the disclosure are not limited to a particular type, but the dopant type selected for a particular transistor is a design choice and is within the scope of embodiments. The logic level (e.g., low or high) of the various signals used in the above description is also for illustration purposes, various embodiments are not limited to a particular level when a signal is activated and/or deactivated, but, rather, selecting such a level is a matter of design choice. Read bit lines (e.g., RERBL, RBL, etc.), read word lines (e.g., REWL, RWL, etc.), write bit lines (e.g., REWBL, REWBLB, WBL, WBLB, etc.), write word line (e.g., REWL, WL, etc.) are data lines (e.g., they carry data).

What is claimed is:

1. A circuit comprising:
   a memory array comprising K number of rows of memory cells;
   a reference column, the reference column comprising:
   M cells of a first cell type configured to provide a first leakage current,
   K-M cells of a second cell type different from the first cell type, the K-M cells are configured to provide a second leakage current, and
   a reference data line connected to the cells of the first cell type and the cells of the second cell type; and a sensing circuit configured to determine a value stored in a memory cell of the memory array based on a voltage of the reference data line, and the memory cell being outside the reference column.

2. The circuit of claim 1, wherein the cells of the first cell type comprise:
a cross latch comprising a first p-type transistor, a second p-type transistor, a first n-type transistor and a second n-type transistor, wherein a source of the first p-type transistor and a source of the second p-type transistor are connected to a supply voltage, a drain of the first n-type transistor is connected to a drain of the first p-type transistor, and a drain of the second n-type transistor is floating.

3. The circuit of claim 2, wherein a drain of the second p-type transistor is connected to a drain of a pass gate transistor.

4. The circuit of claim 2, wherein the cells of the first cell type further comprise:
a first pass gate transistor, wherein a first terminal of the first pass gate transistor is connected to a first reference word data line, a second terminal of the first pass gate transistor is connected to the cross latch, and a gate of the first pass gate transistor is connected to an activation line; and
a second pass gate transistor, wherein a first terminal of the second pass gate transistor is connected to a second reference word date line, a second terminal of the second pass gate transistor is connected to the cross latch, and a gate of the second pass gate transistor is connected to the activation line.

5. The circuit of claim 2, wherein the cells of the first cell type further comprise:
a first transistor, wherein a first terminal of the first transistor connected to the reference line and a gate connected to an activation line; and
a second transistor, wherein a first terminal of the second transistor is connected to a second terminal of the first transistor, a second terminal of the second transistor is connected to a reference voltage and a gate of the second transistor is connected to the cross latch.

6. The circuit of claim 1, wherein the cells of the second cell type comprise:
a cross latch comprising a first p-type transistor, a second p-type transistor, a first n-type transistor and a second n-type transistor, wherein a source of the first p-type transistor and a source of the second p-type transistor are connected to a supply voltage, a drain of the first n-type transistor is connected to a drain of the first p-type transistor, a drain of the second p-type transistor is connected to a reference voltage and a drain of the second n-type transistor is floating.

7. The circuit of claim 6, wherein the cells of the second cell type further comprise:
a first pass gate transistor, wherein a first terminal of the first pass gate transistor is connected to a first reference word data line, a second terminal of the first pass gate transistor is connected to the cross latch, and a gate of the first pass gate transistor is connected to the reference voltage; and
a second pass gate transistor, wherein a first terminal of the second pass gate transistor is connected to a second reference word date line, a second terminal of the second pass gate transistor is connected to the cross latch, and a gate of the second pass gate transistor is connected to the reference voltage.

8. The circuit of claim 6, wherein the cells of the second cell type further comprise:
a first transistor, wherein a first terminal of the first transistor connected to the reference line and a gate connected to the reference voltage; and
a second transistor, wherein a first terminal of the second transistor is connected to a second terminal of the first transistor, a second terminal of the second transistor is connected to a reference voltage, a gate of the second transistor is connected to the cross latch, and a node of the cross latch connected to the gate of the second is at the supply voltage.

9. A circuit comprising:
a memory array comprising K number of rows of memory cells, K being a positive integer;
a reference column, the reference column comprising:
a first set of cells of a first cell type configured to provide a first leakage current,
a second set of cells of a second cell type different from the first cell type, the second set of cells configured to provide a second leakage current, and
a reference data line connected to the first set of cells and the second set of cells,
wherein the reference column is configured to provide a reference current on the reference data line, the reference current being equal to a sum of the first leakage current and the second leakage current; and
a sensing circuit configured to determine a value stored in a memory cell of the memory array based on the reference current, and the memory cell being outside the reference column.

10. A method of reading data stored in a memory cell of a column of memory cells, the method comprising:
activating the memory cell, wherein the column of memory cells comprises K rows, and a data voltage results from the activating the memory cell, K being a positive integer;
activating a reference column different from the column of memory cells, the reference column comprising at least one cell of a first cell type, at least one cell of a second cell type different from the first cell type, and a reference data line connected to the at least one cell of the first cell type and the at least one cell of the second cell type, wherein a reference voltage on the reference data line results from activating the reference column; and
determining the data stored in the memory cell based on the reference voltage and the data voltage.

11. The circuit of claim 9, wherein the first set of cells comprises a cell comprising:
a first transistor having a first terminal coupled to the reference data line, a second terminal, and a gate terminal coupled to a reference word line; and
a second transistor having a first terminal coupled to the second terminal of the first transistor, a second terminal set at a predetermined logic level, and a gate terminal configured to receive a signal that causes the second transistor to be off.

12. The circuit of claim 9, wherein the second set of cells comprises a cell comprising:
a first transistor having a first terminal coupled to the reference data line, a second terminal, and a gate terminal configured to receive a first signal that causes the first transistor to be off; and
a second transistor having a first terminal coupled to the second terminal of the first transistor, a second terminal set at a predetermined logic level, and a gate terminal configured to receive a second signal that causes the second transistor to be on.

13. The circuit of claim 9, wherein the sensing circuit comprises:
   a logic circuit configured to generate a clock signal responsive to a voltage level on the reference data line;
   a latch circuit having an data input terminal, a data output terminal, and a clock terminal, the data input terminal being coupled with a read data line from the memory array, and the clock terminal configured to receive the clock signal; and
   a multiplexer having a first input coupled with the data output terminal of the latch circuit, a second input coupled with the read data line, and a selection input configured to receive the clock signal.

14. The circuit of claim 9, further comprising a read data line coupling between the sensing circuit and the memory cell of the memory array,
   wherein the reference column is configured to have the reference current
      greater than a read zero current on the read data line when the value stored in the memory cell corresponds to a logic low value, and
      less than a read one current on the read data line when the value stored in the memory cell corresponds to a logic high value.

15. The circuit of claim 14, wherein the read zero current of the memory cell is greater than read zero currents of all other memory cells of the memory array.

16. The method of claim 10, wherein
   the at least one of cells of the first cell type comprises a cell comprising:
      a first transistor having a first terminal coupled to the reference data line, a second terminal, and a gate terminal coupled to a reference word line; and
      a second transistor having a first terminal coupled to the second terminal of the first transistor, a second terminal set at a predetermined logic level, and a gate terminal configured to receive a signal that causes the second transistor to be off; and
   the activating the reference column comprises setting a voltage level on the reference word line sufficient to turn on the first transistor.

17. The method of claim 10, wherein the at least one of cells of the second cell type comprises a cell comprising:
   a first transistor having a first terminal coupled to the reference data line, a second terminal, and a gate terminal configured to receive a first signal that causes the first transistor to be off; and
   a second transistor having a first terminal coupled to the second terminal of the first transistor, a second terminal set at a predetermined logic level, and a gate terminal configured to receive a second signal that causes the second transistor to be on.

18. The method of claim 10, wherein the determining the data stored in the memory cell based on the reference voltage and the data voltage comprises:
   generating a latched signal by latching the data voltage responsive to the reference voltage;
   outputting the data voltage when the reference voltage is less than a predetermined voltage level; and
   outputting the latched signal when the reference voltage is no less than the predetermined voltage level.

19. The method of claim 18, further comprising:
   generating a clock signal having a first logic value when the reference voltage is less than the predetermined voltage level and a second logic value when the reference voltage is no less than the predetermined voltage level.

20. The method of claim 18, wherein the generating the latched signal is performed by latching the data voltage using the clock signal as a triggering signal.

* * * * *